United States Patent
Mohan

(10) Patent No.: US 10,914,795 B2
(45) Date of Patent: Feb. 9, 2021

(54) APPARATUS AND METHOD FOR MAGNETIC SENSOR OUTPUT COMPENSATION BASED UPON AMBIENT TEMPERATURE

(71) Applicant: Crocus Technology Inc., Santa Clara, CA (US)

(72) Inventor: Anuraag Mohan, Fremont, CA (US)

(73) Assignee: CROCUS TECHNOLOGY INC., Santa Clara, CA (US)

(*) Notice: Subject to any disclaimer, the term of this patent is extended or adjusted under 35 U.S.C. 154(b) by 0 days.

(21) Appl. No.: 16/280,480

(22) Filed: Feb. 20, 2019

(65) Prior Publication Data

US 2020/0264242 A1 Aug. 20, 2020

(51) Int. Cl.
*G01R 33/00* (2006.01)
*G01R 33/09* (2006.01)

(52) U.S. Cl.
CPC ....... *G01R 33/0082* (2013.01); *G01R 33/098* (2013.01)

(58) Field of Classification Search
CPC ......... G01R 33/098; G01K 13/00; G01K 7/16
See application file for complete search history.

(56) References Cited

U.S. PATENT DOCUMENTS

| | | | | |
|---|---|---|---|---|
| 6,896,407 B2* | 5/2005 | Nomiyama | ......... | F16K 37/0083 251/129.04 |
| 2005/0012496 A1* | 1/2005 | Taniguchi | ............ | G01R 31/364 324/117 R |
| 2007/0136020 A1* | 6/2007 | Yasui | ..................... | G01K 13/00 702/104 |
| 2007/0257659 A1* | 11/2007 | Nomoto | ............... | G01R 15/202 324/76.11 |
| 2013/0335065 A1* | 12/2013 | Fugate | ............... | G01R 33/0035 324/202 |
| 2015/0206776 A1* | 7/2015 | Mimura | ............. | G05D 23/1919 62/3.7 |
| 2017/0227422 A1* | 8/2017 | Cheng | .................... | G01D 5/145 |

* cited by examiner

*Primary Examiner* — Alvaro E Fortich
(74) *Attorney, Agent, or Firm* — Cooley LLP

(57) ABSTRACT

A circuit has a magnetic sensor that produces an uncompensated magnetic sensor output signal. A temperature sensor produces an ambient temperature signal. A compensation circuit is connected to the magnetic sensor and the temperature sensor. The compensation circuit is configured to add a computed temperature compensation signal to the uncompensated magnetic sensor output signal to produce a magnetic sensor temperature compensated output signal that reduces thermally induced variation of the uncompensated magnetic sensor output signal.

5 Claims, 2 Drawing Sheets

APPARATUS AND METHOD FOR MAGNETIC SENSOR OUTPUT COMPENSATION BASED UPON AMBIENT TEMPERATURE

FIELD OF THE INVENTION

This invention relates generally to magnetic sensors employing magnetic tunnel junctions. More particularly, this invention is directed toward magnetic sensor output compensation based upon ambient temperature.

BACKGROUND OF THE INVENTION

Magnetic sensors utilize Magnetic Tunnel Junctions (MTJs), which under appropriate circumstances, act as Tunnel Magneto Resistance (TMR) sensors. A TMR sensor experiences a change in its resistance in the presence of an ambient magnetic field. This makes TMR sensors well-suited for detection of magnetic fields. The sensitivity of magnetic sensors is expressed as a ratio of mV/mT, for a specific bias voltage. This defines the change in output voltage of the sensor for a change in the external magnetic field. The operating temperature of the sensor can vary significantly, in some cases from −40° C. to +155° C. Changes in temperature also change magnetic sensor sensitivity, in some cases, output drift can vary by 5%. The Temperature Coefficient of Sensitivity quantifies the dependence of sensitivity upon temperature. Thermally induced variation of sensitivity impedes the accuracy of magnetic sensors. Thus, there is a need for thermal compensation of the output of magnetic sensors.

SUMMARY OF THE INVENTION

A circuit has a magnetic sensor that produces an uncompensated magnetic sensor output signal. A temperature sensor produces an ambient temperature signal. A compensation circuit is connected to the magnetic sensor and the temperature sensor. The compensation circuit is configured to add a computed temperature compensation signal to the uncompensated magnetic sensor output signal to produce a magnetic sensor temperature compensated output signal that reduces thermally induced variation of the uncompensated magnetic sensor output signal.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
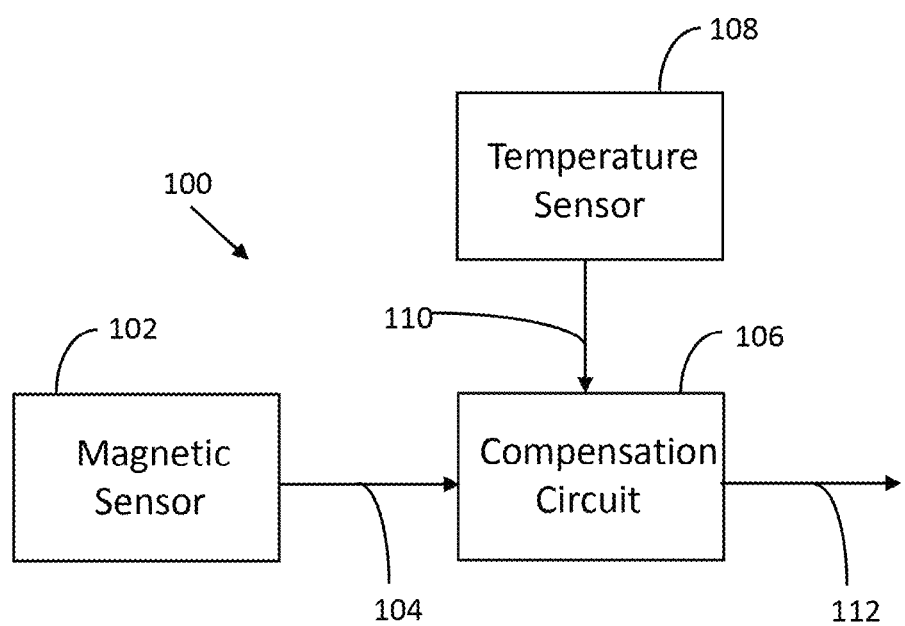
FIG. 1 illustrates a system configured in accordance with an embodiment of the invention.

FIG. 1 illustrates a system 100 configured in accordance with an embodiment of the invention. The system 100 includes a standard magnetic sensor 102, which produces an uncompensated magnetic sensor output signal on node 104. In accordance with the invention, the standard magnetic sensor 102 is supplemented with a compensation circuit 106 and a temperature sensor 108. The temperature sensor 108 produces a signal on node 110 that is proportional to the ambient temperature. The compensation circuit 106 processes the uncompensated magnetic sensor output signal from node 104 and the ambient temperature signal from node 110 to produce a magnetic sensor temperature compensated output signal on node 112. More particularly, the compensation circuit 106 is configured to add a computed temperature compensation signal to the uncompensated magnetic sensor output signal to produce the magnetic sensor temperature compensated output signal that reduces thermally induced variation of the uncompensated magnetic sensor output signal. The compensation circuit 106 forms the computed temperature compensation signal as a function of the ambient temperature signal, a room temperature signal, a room temperature gain signal, a temperature coefficient gain signal and the uncompensated magnetic sensor output signal, as detailed below in connection with FIG. 2.

Figure 2:
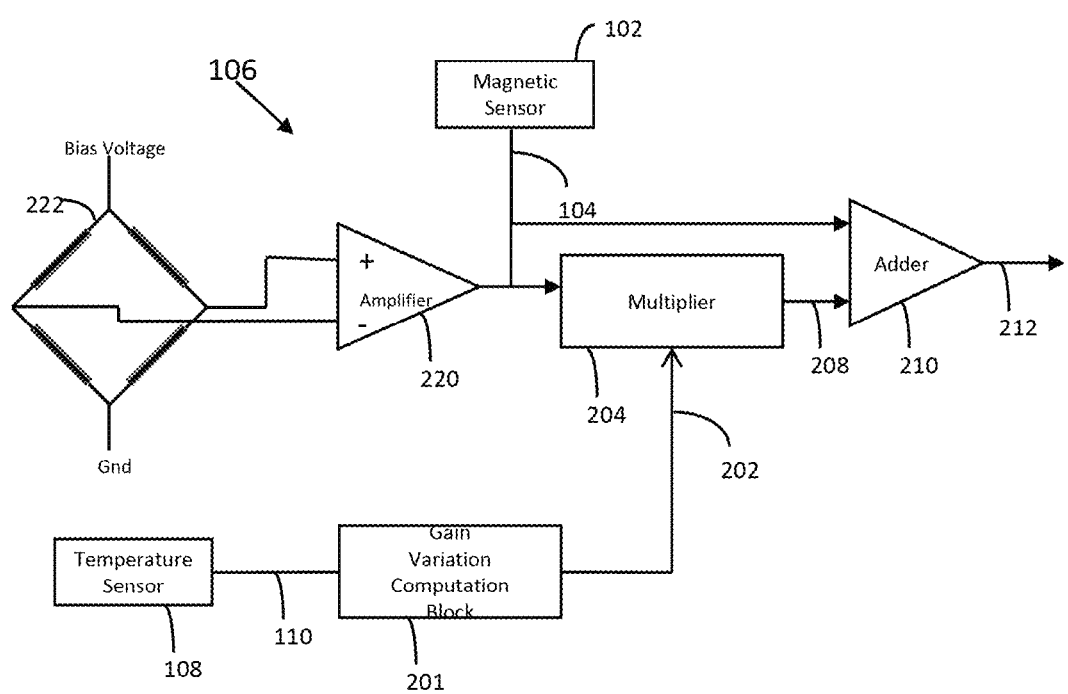
FIG. 2 illustrates a compensation circuit configured in accordance with an embodiment of the invention.

FIG. 2 illustrates compensation circuit 106 along with magnetic sensor 102 and temperature sensor 108. As previously indicated, magnetic sensor 102 may be any standard known magnetic sensor. Temperature sensor 108 may be a discrete temperature sensor Integrated Circuit (IC), such as the TMP 20 sold by Texas Instruments, Dallas, Tex. or a custom designed temperature circuit placed on the same or different IC as the TMR sensor.

Gain variation computation block 201, multiplier 204, adder 210, bridge amplifier 220 and bridge circuit 222 implement computations disclosed herein. The gain variation computation block 201, multiplier 202 and adder 210 may be implemented in hardware, software or hybrid hardware and software circuits. In the case of a software implementation, a simple processor and associated memory may be used to implement the disclosed signal processing. That is, the memory stores instructions executed by the processor to implement the disclosed signal processing operations. In the case of a hardware implementation, adder 210 may be an operational amplifier, multiplier 204 may be a discrete analog multiplier IC, or a custom designed IC that is placed in the same or different IC as the TMR sensor. The gain variation computation block 201 may be implemented with a set of operational amplifiers with a gain programmed as a function of the temperature sensor output signal.

The magnetic sensor temperature compensated output signal ($V_{comp}$) can be expressed as follows:

$$V_{comp} = V_{sense}(G'^* \Delta T^* V_{sense})/G_0$$

Where Vsense is the output signal from the magnetic sensor 102 on node 104. G' is a temperature coefficient of gain, which is a value that may be established from empirical data (e.g., $2.531 \times 10^{-3}$ in one embodiment). $\Delta T$ is the difference between the ambient temperature signal from temperature sensor 108 on node 110 and a room temperature signal value (e.g., corresponding to 23° C.). $G_0$ is a temperature coefficient of gain value at room temperature.

The gain variation computation block 201 is configured to produce a gain variation signal, which may be characterized as $(G'^* \Delta T)/G_0$. The gain variation signal is applied to node 202. The multiplier 204 produces a computed temperature compensation signal, which may be characterized as $(G'^* \Delta T^* V_{sense})/G_0$. The adder 210 adds the output signal from the magnetic sensor 102 on node 104, referred to as $V_{sense}$, to the computed temperature compensation signal to form the magnetic sensor temperature compensated output signal ($V_{comp}$) on node 212. Bridge circuit 222 and amplifier 220 provide a gain to the output signal from the magnetic sensor, if necessary.

The disclosed correction voltage ($V_{comp}$) reduces the Temperature Coefficient of Sensitivity by a factor of 10. The disclosed circuitry substantially eliminates the 5% error range of a standard magnetic sensor 102 across its operating temperature range.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A circuit, comprising:
a magnetic sensor that produces an uncompensated magnetic sensor output signal;
a temperature sensor that produces an ambient temperature signal; and
a compensation circuit connected to the magnetic sensor and the temperature sensor, the compensation circuit configured to add a computed temperature compensation signal to the uncompensated magnetic sensor output signal to produce a magnetic sensor temperature compensated output signal that reduces thermally induced variation of the uncompensated magnetic sensor output signal, wherein the compensation circuit forms the computed temperature compensation signal as a function of the ambient temperature signal, a room temperature signal, a room temperature coefficient gain signal, a temperature coefficient gain signal and the uncompensated magnetic sensor output signal.

2. The circuit of claim 1 wherein the compensation circuit computes a temperature differential signal based upon a difference between the ambient temperature signal and the room temperature signal.

3. The circuit of claim 2 wherein the compensation circuit computes a gain ratio signal based upon the temperature coefficient gain signal divided by the room temperature coefficient gain signal.

4. The circuit of claim 3 wherein the compensation circuit multiplies the gain ratio signal and the temperature differential signal to form a gain variation signal.

5. The circuit of claim 4 wherein the compensation circuit multiplies the gain variation signal by the uncompensated magnetic sensor output signal to form the computed temperature compensation signal.

* * * * *